United States Patent
Taniguchi

[19]

[11] Patent Number: 5,855,641
[45] Date of Patent: Jan. 5, 1999

[54] MOLD FOR MOLDING OPTICAL ELEMENT

[75] Inventor: Yasushi Taniguchi, Kawasaki, Japan

[73] Assignee: Canon Kabushiki Kaisha, Tokyo, Japan

[21] Appl. No.: 739,928

[22] Filed: Oct. 30, 1996

Related U.S. Application Data

[60] Continuation of Ser. No. 478,442, Jun. 7, 1995, abandoned, which is a division of Ser. No. 453,354, May 30, 1995, Pat. No. 5,711,780, which is a continuation of Ser. No. 70,060, Jun. 2, 1993, abandoned.

[30] Foreign Application Priority Data

Jun. 8, 1992 [JP] Japan ................................. 4-171526

[51] Int. Cl.$^6$ .......................... C03B 11/08; C03B 40/00; B29C 33/56
[52] U.S. Cl. .......................... 65/286; 65/305; 65/374.1; 65/374.15; 65/26; 425/808; 249/114.1; 249/115; 106/38.28
[58] Field of Search ................... 65/24, 26, 60.6, 65/169, 170, 286, 305, 374.1, 374.15, 374.11, 374.13, 60.2; 425/808; 249/114.1, 115; 106/38.27, 38.28; 148/900, 239, DIG. 83, DIG. 84; 204/192.16, 192.15; 427/523, 525, 528, 529, 133, 135

[56] References Cited

U.S. PATENT DOCUMENTS

| | | |
|---|---|---|
| 2,246,463 | 6/1941 | Garratt et al. ............ 65/374.15 |
| 4,105,443 | 8/1978 | Dearnaley et al. ............ 148/900 |
| 4,352,698 | 10/1982 | Hartley et al. ............... 148/4 |
| 4,629,631 | 12/1986 | Dearnaley et al. ............ 427/38 |
| 4,724,016 | 2/1988 | Anthony ................... 148/900 |
| 4,793,792 | 12/1988 | Akino . |
| 4,882,827 | 11/1989 | Kusumi et al. .......... 65/374.15 |
| 4,932,331 | 6/1990 | Kurihara et al. ......... 106/286.1 |
| 4,935,303 | 6/1990 | Ikoma et al. ............... 428/408 |
| 5,008,002 | 4/1991 | Uno et al. . |
| 5,026,415 | 6/1991 | Yamamoto et al. .......... 65/305 |
| 5,112,025 | 5/1992 | Nakayama et al. . |
| 5,202,156 | 4/1993 | Yamamoto et al. .......... 427/135 |
| 5,711,780 | 1/1998 | Taniguchi .................. 65/286 |

FOREIGN PATENT DOCUMENTS

| | | |
|---|---|---|
| 4002681 | 8/1990 | Germany . |
| 4302046 | 8/1993 | Germany . |
| 49-51112 | 5/1974 | Japan . |
| 52-45613 | 4/1977 | Japan . |
| 5460312 | 5/1979 | Japan . |
| 60-246230 | 12/1985 | Japan . |
| 61-183134 | 8/1986 | Japan . |
| 61-281030 | 12/1986 | Japan . |
| 63-30342 | 2/1988 | Japan . |
| 64-83529 | 3/1989 | Japan . |
| 1301864 | 12/1989 | Japan . |
| 2-26842 | 1/1990 | Japan . |
| 2-51434 | 2/1990 | Japan . |
| 2283627 | 11/1990 | Japan . |
| 5124825 | 5/1993 | Japan . |
| 2068019 | 8/1981 | United Kingdom . |

OTHER PUBLICATIONS

Dearnaley, "Applications of Ion Implantation in Metals & Alloys", IEEE Transactions on Nuclear Science, vol. NS–28, No. 2, Apr. 1981, pp. 1808–1811.

Diamond–Like Hydrocarbon and Carbon Films, John C. Angus et al., Case Western Reserve University, "Diamond and Diamond–Like Films and Coatings."

Journal of Applied Physics, vol. 42, No. 7, Jun. 1971, S. Aisenberg et al. "Ion–Beam Deposition of Thin Films of Diamondlike Carbon."

*Primary Examiner*—Steven P. Griffin
*Attorney, Agent, or Firm*—Fitzpatrick, Cella, Harper & Scinto

[57] ABSTRACT

Molds for press molding an optical element of glass are disclosed. Proposed are: (1) A mold contains oxygen at the interface between a mold base of the mold and a carbon film formed at least on the molding surface of the mold base with an oxygen amount of 0–10 atom % and with the interface of a width of 0–500 Å, (2) a mold subjected to carbon ion injection at least on the molding surface of the mold base, and (3) a mold subjected to ion injection during or after formation of a carbon film at least on the molding surface of the mold base material.

8 Claims, 8 Drawing Sheets

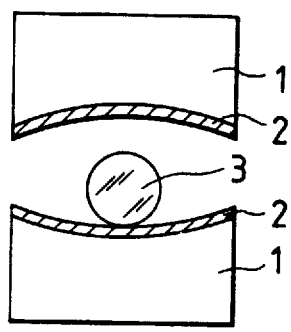
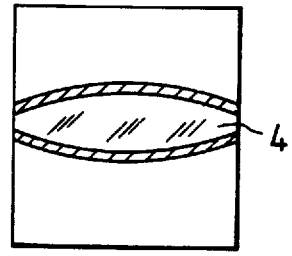
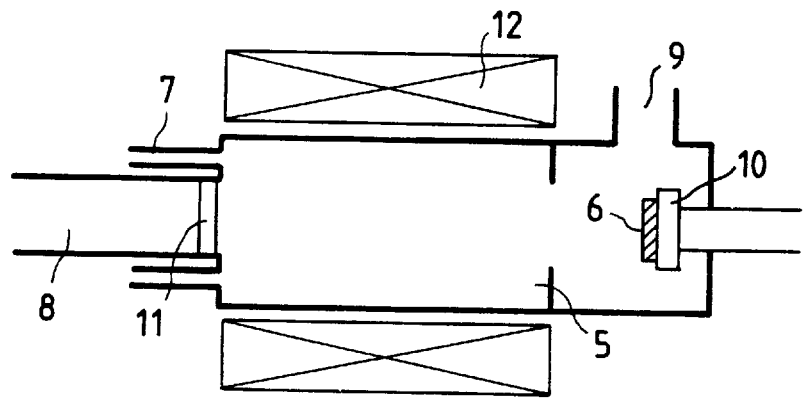

MOLD FOR MOLDING OPTICAL ELEMENT

This application is a continuation of application Ser. No. 08/478,442 filed Jun. 7, 1995, now abandoned; which is a division of application Ser. No. 08/453,354, filed May 30, 1995, now U.S. Pat. No. 5,811,780; which in turn, is a continuation of application Ser. No. 08/070,060, filed Jun. 2, 1993, now abandoned.

BACKGROUND OF THE INVENTION

1. Field of the Invention

The present invention relates to a mold for producing a glass optical element such as a lens or a prism by press molding of a glass material.

2. Related Background Art

The lens production technology using press molding of glass material without a polishing process has enabled simple and inexpensive production of lenses, without relying on the complex steps required in the conventional technology, and has recently been employed not only in the production of lenses but also prisms and other glass optical elements.

The properties required for the mold employed in such press molding of the glass optical elements include excellent hardness, heat resistance, releasing property and mirror smoothness. For the material constituting such mold, there have been various proposals including metals, ceramics and materials coated therewith. For example, the Japanese Patent Laid-open Application No. 49-51112 proposes 13Cr martensite steel, the Japanese Patent Laid-open Application No. 52-45613 proposes SiC and $Si_3N_4$, the Japanese Patent Laid-open Application No. 60-246230 proposes an ultra hard alloy coated with a precious metal, the Japanese Patent Laid-open Application Nos. 61-183134, 61-281030 and 1-301864 propose a thin diamond film or a diamond-state carbon film, and the Japanese Patent Laid-open Application No. 64-83529 proposes a material coated with a hard carbon film.

However, 13Cr martensite steel has the drawbacks of being easily oxidized, and coloration of the glass due to Fe diffusion therein at a high temperature. SiC and $Si_3N_4$ are generally regarded as not being oxidized, but are still oxidized at a high temperature, thus forming a $SiO_2$ film on the surface and causing glass fusion thereto. Also, they have a drawback that the shaping of the mold itself is extremely difficult because of the high hardness. The material coated with the precious metal does not easily cause glass fusion, but is easily damaged or deformed because it is extremely soft.

The mold employing the diamond thin film, the diamond-like carbon (DLC) film, the hydrogenated amorphous carbon (a-C:H) film or the hard carbon film shows satisfactory separation between the mold and the glass and does not cause glass fusion, but may result in an unsatisfactory molding performance due to the partial peeling of such film, after several hundred molding operations. These reasons are considered as follows:

(1) The above-mentioned films have a very large compression stress, and are peeled or cracked as a result of the stress release, caused by the rapid heating and rapid cooling in the molding process. Similar phenomena result from the thermal stress caused by the thermal cycles and the difference in the thermal expansion coefficients of the base material and the film constituting the mold; (2) In certain base materials of the mold, the film may not be formed locally or may be locally thinner depending on the surface state. For example, in a sintered material of WC-Co, SiC or $Si_3N_4$, voids of particles or pores in sintering are unavoidable, so that the polished surface contains holes of several microns or larger. If a film is formed on such surface, it may not be formed or may become extremely thin in such holes. Consequently, such locations may induce formation of peeling or crack since the adhesion strength or mechanical strength of the film become extremely low in such locations; (3) The sintering material in the sintered material, as represented by Co in WC-Co, forms an alloy by diffusion with said film. Such portion causes glass fusion in the molding operation, thus generating a precipitate by reaction with the glass components and deteriorating the durability of the mold.

As explained above, the mold for optical elements, excellent in molding property, durability and economical property has not been realized.

SUMMARY OF THE INVENTION

A first invention resolves the above-mentioned drawbacks by a mold provided with an area, at the interface between a mold base of the mold and a carbon film formed on the molding surface of the mold base, in which an element constituting the mold base and an element constituting the film are combined with oxygen.

Carbon has been employed in the mold for molding glass, because glass is not well compatible with carbon. In glass molding to be performed with more precision, the hard and smooth carbon film is formed on the molding surface of the mold base of the mold. However, since such film has a high internal stress and lacks thermal stability in the high temperature range for glass molding, the adhesion strength between the mold base and the film is reduced with the number of molding operations. Stated differently, the drawback of the carbon film, as the surface material for the glass mold is principally related to the adhesion strength between the mold base and the film.

This drawback can be prevented, in the present invention by the formation of a carbon film such as a diamond film, a DLC film, an a-C:H film or a hard carbon film on the molding surface of the mold base of the mold by forming an area containing oxygen bonded to the mold base and the carbon film in order to improve the adhesion strength of the mold base and the film. The oxygen-containing area does not constitute the spontaneous oxide film ordinarily present on the surface of the mold base, but is formed after elimination of the spontaneous oxide film. Oxygen is bonded at the base material side to a constituent element thereof, and at the carbon film side to oxygen and/or hydrogen. Such interface containing such oxygen atoms can be formed at the formation of the carbon film by irradiating an oxygen ion beam or oxygen plasma, or employing a material containing oxygen in the initial stage of carbon film formation, or effecting a heat process in an atmosphere containing a suitable amount of oxygen after the formation of the carbon film. The amount of oxygen in the interface is generally in a range of 1–10 atom. %, because an oxygen amount exceeding 10 atom. % deteriorates the adhesion strength between the mold base and the film, while an amount less than 1 atom. % does not improve the adhesion strength. Also, the thickness of the oxygen-containing interface is generally in a range of 5–500Å, because a thickness exceeding 500Å not only deteriorates the adhesion strength of the mold base and the film but also deteriorates the hardness of the film, while a thickness less than 5Å does not improve the adhesion strength.

In the present invention, a material used for the mold base is selected from the group consisting of WC, SiC, TiC, TaC, BN, TiN, AlN, $Si_3N_4$, $SiO_2$, $Al_2O_3$, $ZrO_2$, W, Ta, Mo, thermet, thialon, mulite, carbon composite (C/C), carbon fibers (CF) and WC-Co alloy. The above-mentioned carbon film is formed on the molding surface of such mold base. The diamond film is formed by microwave plasma CVD, thermal filament CVD, plasma jet or electron cyclotron resonance plasma CVD. Also, the DLC film, a-C:H film or hard carbon film is formed, for example, by plasma CVD, ion beam sputtering, ion beam evaporation of plasma sputtering. Examples of the gas employed for film formation include hydrocarbons such as methane, ethane, propane, ethylene, benzene or acetylene; halogenated hydrocarbons such as methylene chloride, carbon tetrachloride, chloroform or trichloroethane; alcohols such as methyl alcohol or ethyl alcohol; ketones such as $(CH_3)_2CO$ or $(C_6H_5)_2CO$; gasses such as CO or $CO_2$; and mixtures of the gasses with other gasses such as $N_2$, $H_2$, $O_2$, $H_2O$ or Ar.

As explained above, the first invention provides a mold having, at the interface between the mold base of the mold and the carbon film such as the diamond film, DLC film, a-C:H film or hard carbon film formed on the molding surface of the mold base, an area in which the constituent element of the mold base material and that of the film are bonded with oxygen, thereby improving the adhesion strength between the mold base and the film and improving the durability of the mold.

A second invention prevents the above-mentioned drawbacks by a mold in which carbon ions are introduced into the molding surface of the mold base of the mold by ion injection or ion implantation, or a mold in which a carbon film is formed after carbon ion introduction.

The ion injection or implantation is a technology for forming a surficial layer of certain properties different from those of the bulk material by ionizing the particles to be implanted and accelerating the particles toward a solid substrate by a voltage of several 10 keV to several 100 keV in ultra high vacuum. The ions penetrating the solid lose energy by repeated collisions with the atoms constituting the substrate. As a result, the implanted ions remain in the solid substrate, and the penetration depth in ordinary ion implantation is about 0.01 to 1 μm. The distribution of the implanted ions in the solid can be determined by LSS theory for most ions and most solids in case the solid is amorphous. Also, the depth and spreading of the maximum concentration are determined by the substrate, the implanted ions and the acceleration energy thereof.

The present invention can resolve the aforementioned drawback in the adhesion strength between the mold material of the mold and the carbon film by forming an injected-carbon layer on the surficial part of the molding surface by means of injection of carbon ions into the molding surface. The injected layer shows satisfactory adhesion to the mold base, a surface hardness at least comparable to that of the mold base, and satisfactory thermal stability at the high temperature. The amount of injection is preferably in a range of $10^{15}$ to $10^{18}$ ions/$cm^2$, because an amount less than $10^{15}$ ions/$cm^2$ results in unsatisfactory releasing property from glass, while an amount exceeding $10^{18}$ ions/$cm^2$ deteriorates the surface state because the molding surface is sputtered. Then, a heat treatment of the mold base during or after the injection spreads the distribution by acceleration and diffusion of the injected ions, thus realizing a deep penetration. As a result, the adhesion to the mold base is further improved, and the thermal stability is improved.

When the carbon film is formed on the molding surface subjected to the injection of carbon ions, the adhesion of the mold base and the film is improved in comparison with the case without the ion injection. The adhesion between the mold base and the film can be further improved by irradiating the injected surface with hydrogen plasma for eliminating the surficial amorphous (graphite) portion in the ion-injected layer prior to the formation of the carbon film. In such case the lower limit of the amount of the injected ions may be less than $10^{15}$ ion/$cm^2$. The carbon film formed on the ion-injected molding surface is a diamond film, an a-C:H film, a DLC film, a hard carbon film, or a film consisting of a mixture of at least two thereof. The mold base, the method for forming these films, and the examples of the gas to be employed are same as explained before.

As explained above, the second invention improves the adhesion strength between the mold base of the mold and the film by injecting carbon ions into the molding surface of the mold base or by forming a carbon film such as a diamond film, a DLC film, an a-C:H film or a hard carbon film after said ion injection, thereby improving the durability of the mold.

A third invention prevents the above-mentioned drawbacks by a mold subjected to ion injection during or after formation of a carbon film on the molding surface of the mold base of the mold.

During or after formation of a carbon film such a diamond film, a DLC film, an a-C:H film or a hard carbon film on the molding surface of the base material of the mold, high energy ions having a flying stroke larger than the interface of the film are injected preferably with a concentration of $10^{14}$ ion/$cm^2$ or higher, thereby mixing the atoms of the mold base and the film at the interface the region where the atoms of the mold base and the film are mixed at the interface is referred to as the interfacial region. The beam mixing is used for mixing the atoms at the interface of the base material and the film, thereby eliminating the sharp interface or forming a compound by atom mixing.

When a solid substrate is irradiated with an ion beam of several keV or higher, the surficial layer of the substrate is scraped by sputtering, while the irradiating ions penetrates the surficial part of the substrate. The penetrating ions collide with the atoms of the solid substrate, thereby losing energy, and are eventually stopped. The collision may occur in nuclear mode or in electronic mode. The former causes extraction of the substrate atoms while the latter causes excitation. These phenomena can cause a structural change, and the ion beam irradiation can vary the composition or structure of the surface layer of the solid substrate, thereby modifying the surficial layer also in macroscopic manner. Also, the ion irradiation on a thin film provides, under a condition that the ion beam passes the interface of the thin film and the base material, an effect of causing the atom mixing in the vicinity of the interface, not only in the direction of depth but also in a direction perpendicular to the incident direction of the ion beam. The irradiating ions, upon entering the solid substrate, lose energy by repeated collisions with the atoms of the solid and are eventually stopped in the solid substrate. The depth of penetration is about 0.01 to 1 μm in the ordinary ion injection. The distribution of the implanted ions in the solid is determined by LSS theory for most ions and most solids in case the solid is amorphous. Also the depth and spreading of the maximum concentration are determined by the substrate, the implanted ions and the energy thereof.

The present invention can resolve the aforementioned drawback in the adhesion strength between the mold base of the mold and the carbon film, by injecting ions of a high energy having a flying stroke larger than the interface of the carbon film, thereby causing atom mixing at the interface between the molding surface and the film during or after formation of a carbon film which is not compatible with glass, such as a diamond film, a DLC film, an a-C:H film or a hard carbon film, on the molding surface of the mold base. An injected amount of ions at least equal to $10^{14}$ ion/cm$^2$ can provide a sufficient mixing effect at the interface between the mold base and the film. However, a range of $10^{14}$ to $10^{18}$ ion/cm$^2$ is preferred as long as possible because an amount exceeding $10^{18}$ ion/cm$^2$ may crease a coarse surface. A heat treatment during or after the mixing spreads the distribution by acceleration and diffusion of the ions, thereby attaining a deeper penetration and improving the mixing effect. As a result, the adhesion to the mold base is further improved, and the thermal stability is also improved. The carbon film formed on the molding surface subjected to the ion implantation can be a diamond film, a DLC film, an a-C:H film or a hard carbon film, or a film of a mixture of at least two thereof. The mold base, the method for film formation and the examples of the gas to be employed are same as explained before.

As explained above, the third invention improves the adhesion strength between the mold base of the mold and the film by ion injection during or after the formation of a carbon film such as a diamond film, a DLC film, an a-C:H film or a hard carbon film on the molding surface of the mold base, thereby improving the durability of the mold.

BRIEF DESCRIPTION OF THE DRAWINGS

FIG. 1 is a cross-sectional view of an embodiment of the mold for optical element of the present invention prior to press molding;

FIG. 2 is a cross-sectional view of an embodiment of the mold for optical element of the present invention after press molding;

FIG. 3 is a schematic view of an ECR plasma CVD apparatus employed in the embodiment of the present invention;

DESCRIPTION OF THE PREFERRED EMBODIMENTS

Figure 4:
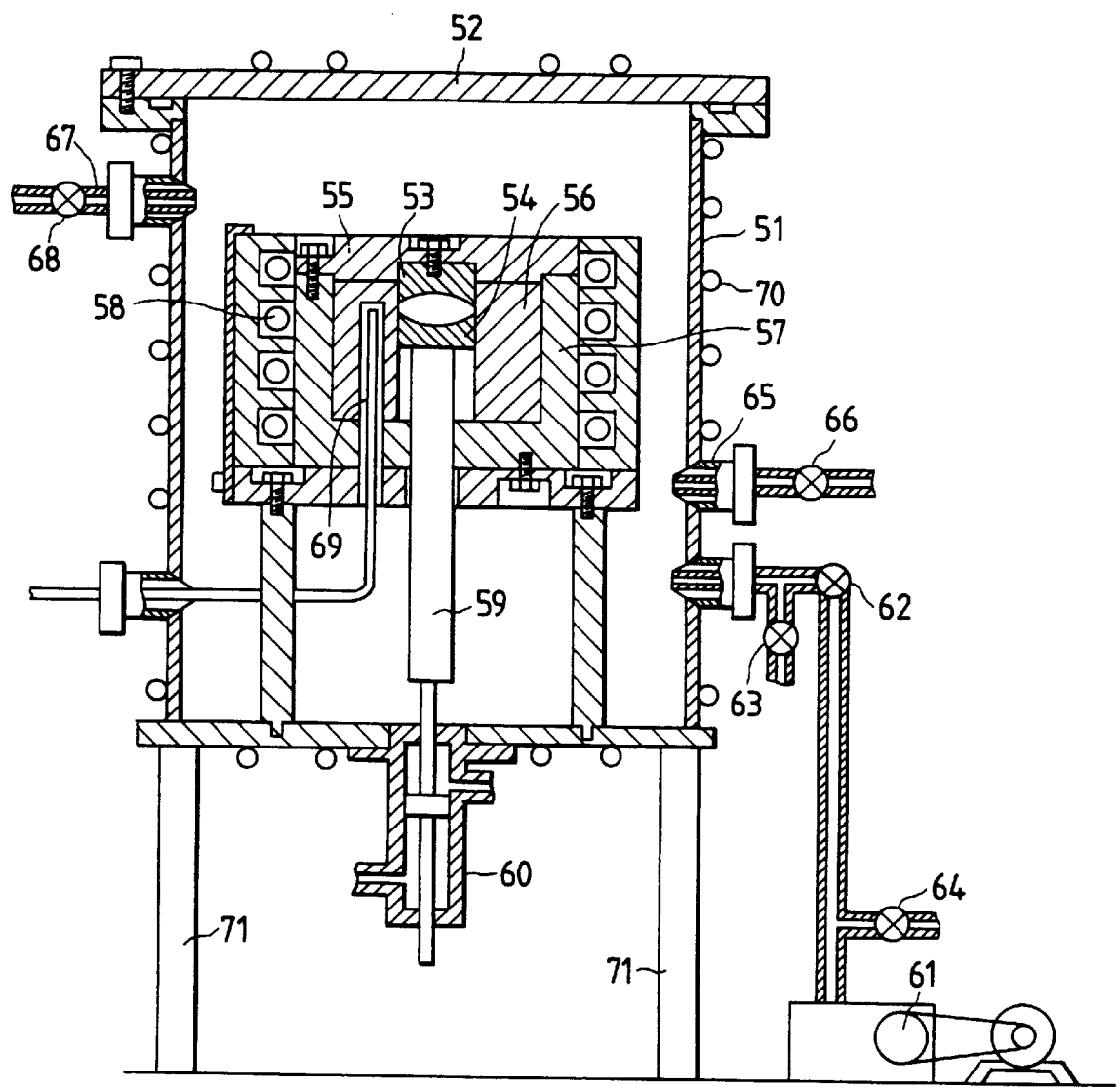
FIG. 4 is a cross-sectional view of a non-continuous lens molding apparatus employing the mold for optical element of the present invention.

The present invention will be explained in detail by preferred embodiments thereof with reference to the attached drawings.

[Embodiment having oxygen atoms at the interface of carbon film and base material of the mold (Examples 1–6)]

(Example 1)

FIGS. 1 and 2 illustrate an embodiment of the mold for optical element, of the present invention. FIG. 1 shows the state of press molding surfaces for the optical element. FIG. 2 shows a state after press molding. There are shown a mold base 1, a DLC film 2 having a molding surface for producing the optical element, a glass material 3, and an optical element 4. The optical element 4 such as a lens is formed by press molding the glass material 3 placed between the mold members as shown in FIG. 1.

In the following there will be given a detailed explanation on the mold of the present invention, for producing the optical element.

The base material of the mold was formed by working sintered SiC into a predetermined shape, then forming a polycrystalline SiC film by CVD, and mirror polishing the molding surface. After sufficient washing, the mold base was placed in an ECR plasma CVD apparatus shown in FIG. 3, in which there are illustrated a plasma generating chamber 5, a mold 6, a gas supply system 7, a microwave oscillator 8 with a wave guide, an evacuating system 9, and a sample holder 10. After the apparatus was evacuated to $1\times10^{-6}$ Torr, argon was supplied at 50 sccm from gas supply system to a pressure of $2\times10^{-2}$ Torr. Then, microwave of 2.45 GHz was applied by the oscillator 8 with a power of 500 W, thereby effecting a cleaning process for eliminating the surfacial oxide film by about 350 Å with argon plasma. Then oxygen was introduced at 50 sccm from the gas supply system with a pressure of $3\times10^{-2}$ Torr. Microwave of 2.45 GHz was applied with a power of 700 W to form ECR oxygen plasma for irradiating the surface of the base material for 2 minutes. Further, $C_6H_6$ was charged at 25 sccm from the gas supply system at a pressure of $2\times10^{-3}$ Torr, and microwave of 2.45 GHz was applied by the oscillator 8 with a power of 500 W. At the same time an external electromagnet 12 applied a diverging magnetic field of 1500 Gauss at a microwave introduction window 11, 875 Gauss at the exit of the plasma chamber, and 650 Gauss at the position of the base. Also, a negative bias of –500 V was applied to the base by a bias source (not shown) to form a DLC film of a thickness of 2000 Å. In this operation the base was heated to 300° C.

There will be explained an example of press molding of glass lenses with the mold of the present invention. In FIG. 4, there are shown a vacuum tank 51, a cover 52 thereof, an upper mold 53 for forming the optical element, a lower mold 54, a support member 55 for the upper mold, a cylindrical mold 56, a mold holder 57, a heater 58, a push-up rod 59 for the lower mold, an air cylinder 60 for driving the push-up rod, an oil rotary pump 61, valves 62, 63, 64, an inert gas pipe 65, a valve 66, a leak valve 67, a valve 68, a temperature sensor 69, a cooling water pipe 70, and a table 71 supporting the vacuum tank.

The lens producing process will be explained in the following.

Figure 5:
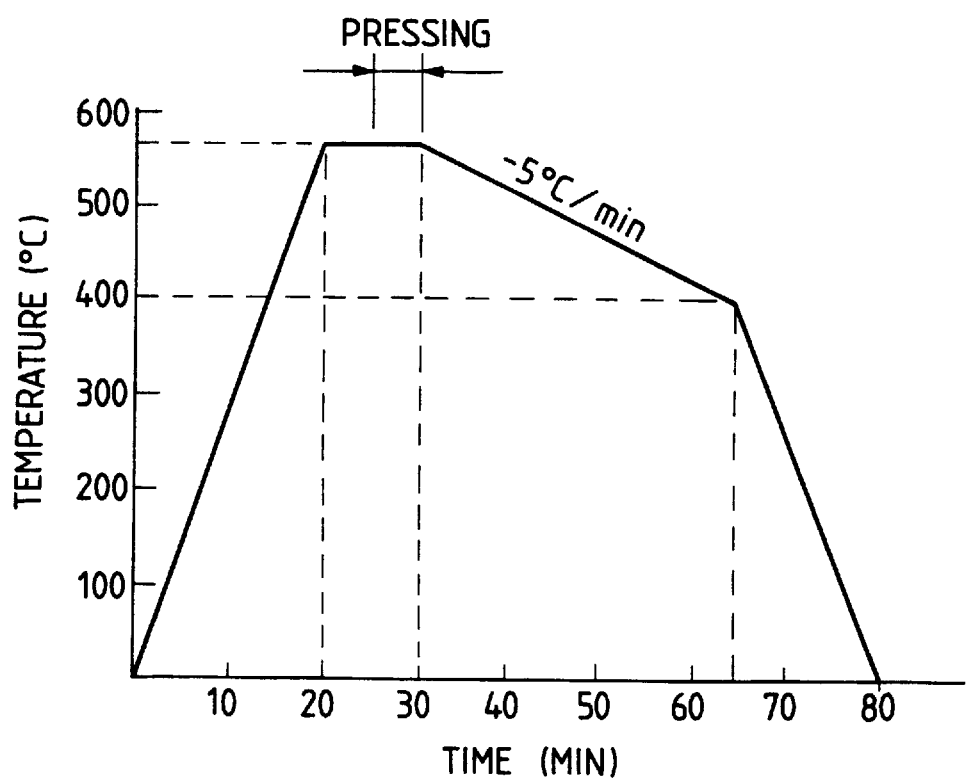
FIG. 5 is a chart of the time-temperature relationship in lens molding.

A spherical glass material consisting of a predetermined amount of flint optical glass (SF14), is placed in the cavity of the mold members, which are then placed in the molding apparatus. Subsequently, the cover 52 of the vacuum tank 51 is closed, then water is supplied in the cooling water pipe 70, and the heater 58 is powered. In this state the nitrogen valves 66, 68 are closed, and the evacuating valves 62, 63, 64 are also closed. The oil rotary pump 61 is continuously operated. The valve 62 is opened to start evaluation, and is closed when the pressure reaches $10^{-2}$ Torr or lower. Then, the valve 66 is opened to introduce nitrogen into the vacuum tank from a container. When a predetermined temperature is reached, the air cylinder 60 is activated to effect pressurization for 1 minute at 200 kg/cm . After the pressure is released, the cooling is conducted with a rate of $-5°$ C./min to a temperature below the transition point, and is then continued with a rate of $-20°$ C./min or higher. When the temperature becomes 200° C. or lower, the valve 66 is closed, and the leak valve 63 is opened to introduce air into the vacuum tank 51. Then, the cover 52 is removed, the upper mold support is removed, and the molded article is taken out. A lens 4 shown in FIG. 2 was molded in the above-explained manner with the flint optical glass SF14 (softening point Sp=586° C.; transition temperature Tg=485° C.). FIG. 5 shows the molding conditions, or the time-temperature relationship in this process.

The above-explained mold was used in molding operations three hundreds (300) times. In the observations under an optical microscope or a scanning electron microscope (SEM), the mold after the molding operations did not show defects such as scar or crack, nor Pb precipitation resulting from reduction of PbO contained in the glass nor glass fusion. Also the molded article was satisfactory in the surface roughness, surface accuracy, transmittance and precision of the shape, and was free from Pb precipitation or gas preservation at the molding operation.

Figure 6:
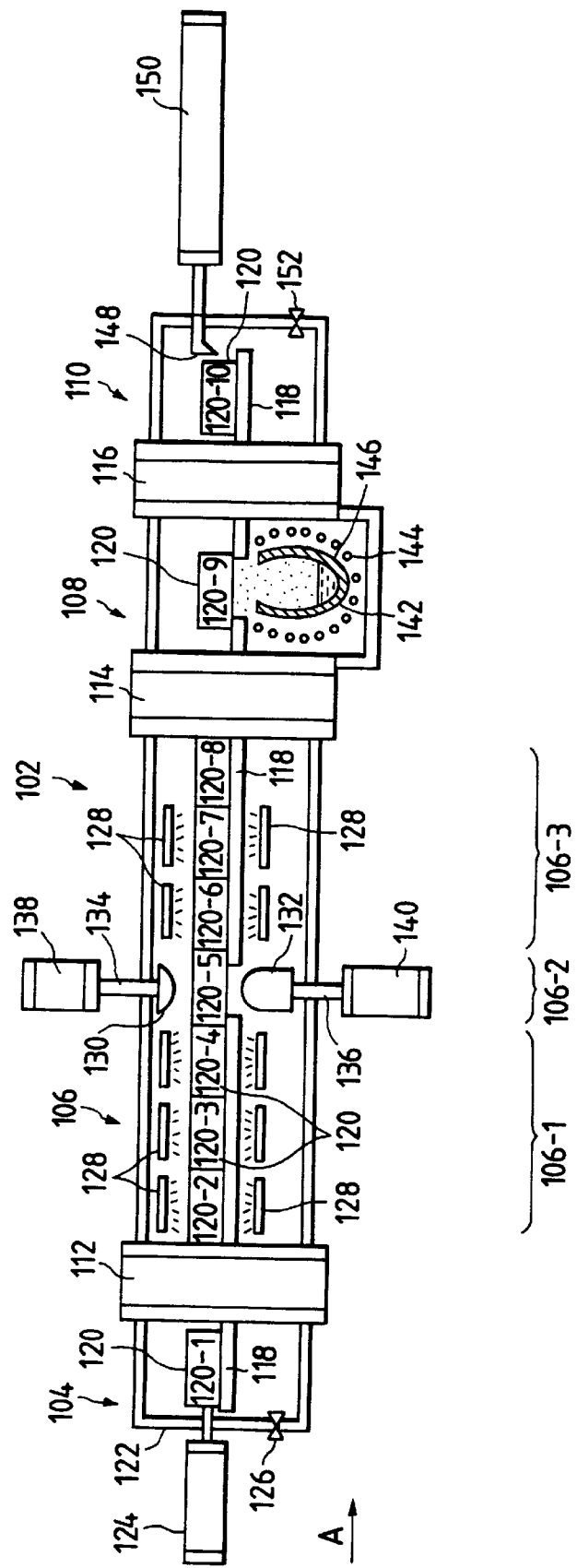
FIG. 6 is a cross-sectional view of a continuous lens molding apparatus employing the mold for optical element of the present invention.

Then, the mold was used in the molding operation with a molding apparatus shown in FIG. 6.

In FIG. 6 there are shown a molding apparatus 102, an intake replacement chamber 104, a molding chamber 106, an evaporation chamber 108, a take-out replacement chamber 110, gate valves 112, 114, 116, rails 118, a palette 120 moved in a direction A on the rails, cylinders 124, 138, 140, 150, valves 126, 152, and heaters 128 provided along the rails 118 in the molding chamber 106.

The molding chamber 106 is divided, into a heating zone 106-1, a pressing zone 106-2 and an annealing zone 106-3, along the transporting direction of the palette. In the pressing zone 106-2, an upper mold 130 is fixed to the lower end of a rod 134 of said cylinder 138, and a lower mold 132 is fixed to the upper end of a rod 136 of the cylinder 140. The upper and lower molds 130, 132 are the molds of the present invention. In the evaporation chamber 108, there are provided a container 142 containing an evaporation material 146, and a heater 144 for heating the container.

A blank for molding was prepared by rough working of crown glass SK12 (softening point Sp=672° C.; glass transition temperature Tg=550° C.) into predetermined shape and dimension. The glass blank was placed on the palette 120. The palette was placed at a position 120-1 in the intake replacement chamber 104, and was pushed in the direction A by a rod 122 of the cylinder 124 to a position 120-2 in the molding chamber 106 across the gate valve 112. Subsequently, the palettes were introduced in succession at predetermined timings into the replacement chamber 104, and were transported from the position 120-2 to 120-8 in the molding chamber 106. During the transportation, the glass blank was gradually heated by the heaters 128 in the heating zone 106-1, brought to a temperature exceeding the softening point in the position 120-4, and brought to the pressing zone 160-2. The cylinders 138, 140 were activated to effect the pressing operation with the upper and lower molds for 1 minute at a pressing temperature of 620° C. with a pressure of 200 kg/cm$^2$. Thereafter, the pressure was released, then cooling was conducted to a temperature below the glass transition point, and the cylinders 138, 140 were operated to release the upper and lower molds from the molded glass. In the pressing operation, the palette was utilized as a cylindrical mold. Thereafter, the molded glass was gradually cooled in the annealing zone 106-3. The molding chamber 106 was filled with inert gas. The palette having reached the position 120-8 in the molding chamber 106 was transported then to a position 120-9 in the evaporation chamber 108 across the gate valve 114. There is usually vacuum evaporation conducted, which was omitted in this example. Subsequently, the molded glass was transported to a position 120-10 in the replacement chamber 110 across the gate valve 116. Then, the molded glass was taken out from the molding apparatus by a rod 148 of the cylinder 150.

After molding operations three thousands (3000) times as explained above, the mold members showed satisfactory results in the molding surface state, the surface roughness of the molded optical element, and the releasing property of the molds from the molded optical element. In the observations under an optical microscope and a SEM, the molding surface of the mold did not show defects such as scar or crack, nor Pb precipitation nor glass fusion.

(Example 2)

Figure 7:
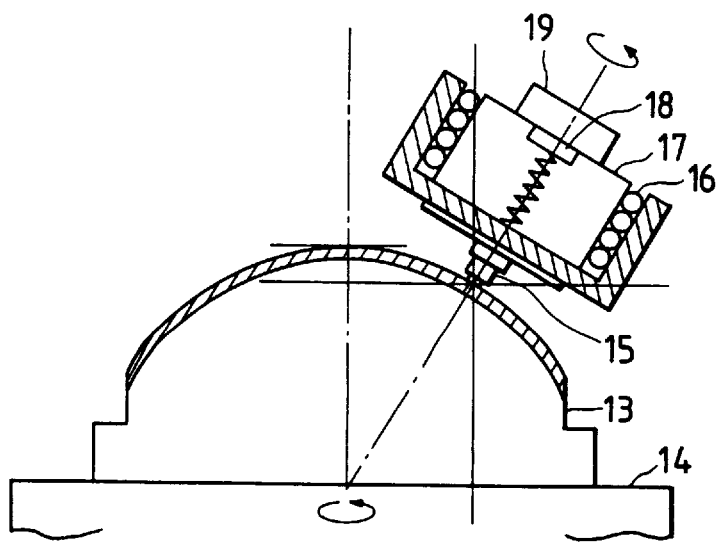
FIG. 7 is a schematic view of a polishing apparatus employed in the embodiment of the present invention.

After sintered $Si_3N_4$ was worked into a predetermined shape as a mold base, it was subjected to a scarring process by ultrasonic vibration in alcohol containing diamond grinding particles of a diameter of 5–10 $\mu$m in order to increase the diamond nucleation density. After sufficient washing, the mold base was placed in the film forming apparatus shown in FIG. 3, and was irradiated with oxygen plasma as in the example 1 after surface cleaning with argon ions. Then, $CH_4$ at 1.4 sccm and $H_2$ at 300 sccm were supplied from the gas supply system with a pressure of 50 Torr. Microwave of 2.45 GHz was applied with a power of 1000 W to generate ECR plasma in the vicinity of the base. The mold base was heated to 800° C. to form a polycrystalline diamond film with a thickness of 10 $\mu$m. Since the film was relatively rough (P–V=0.1 $\mu$m), it was mirror polished to a surface roughness of $R_{max}$=0.02 $\mu$m with diamond grinding particles in a polishing apparatus shown in FIG. 7. In FIG. 7 there are shown a mold 13, an air bearing 14, a polishing dish 15, a bearing 16, an air bearing 17, a spring 18, and a motor 19. The polishing was conducted in an aspherical shape to the above-mentioned surface roughness by local polishing with the polishing dish rotated at 1000 rpm and positioned always in the normal direction to the surface to be polished. The obtained mold was subjected to a molding test similar to that of the example 1 and provided results similar to those in the example 1.

(Example 3)

Figure 8:
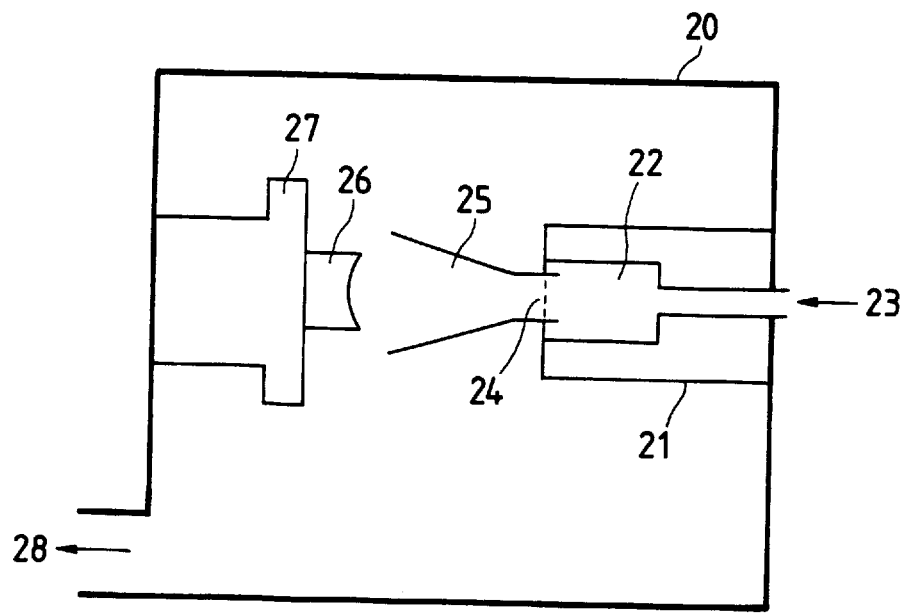
FIG. 8 is a schematic view of an IBD apparatus employed in the embodiment of the present invention.
Figure 9:
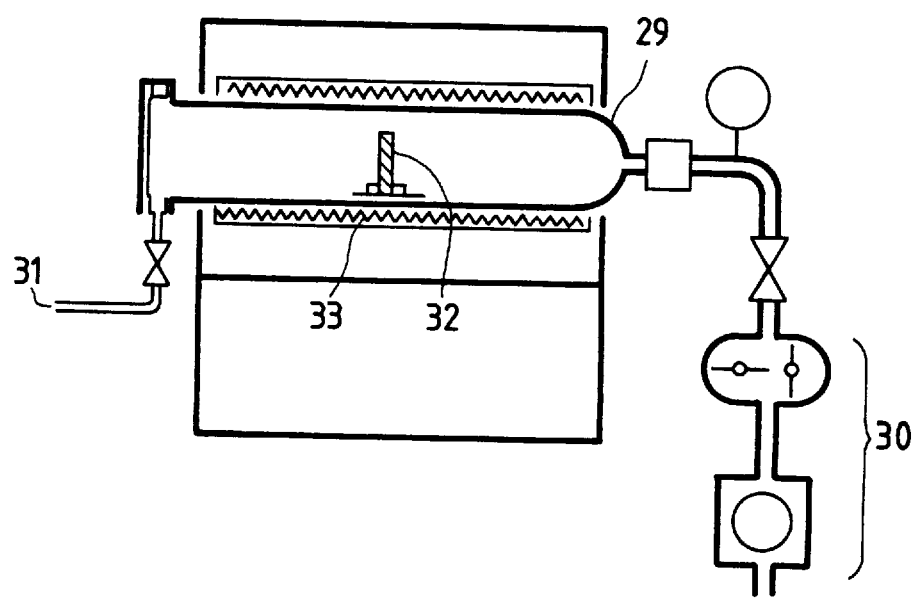
FIG. 9 is a schematic view of a convection oven employed in the embodiment of the present invention.

A mold base same as in the example 1 was subjected to the formation of an a-C:H film by an IBD (ion beam deposition) apparatus which is schematically shown in FIG. 8, wherein shown are a vacuum tank 20, an ion beam generator 21, an ionizing chamber 22, a gas inlet 23, an ion beam extracting grid 24, an ion beam 25, a mold base material 26, a substrate holder 27 with a heater, and an evacuating outlet 28. At first argon was introduced at 30 sccm from the gas inlet into the ionizing chamber and was ionized, and a voltage of 450 V was applied to the extracting grid to obtain an ion beam for irradiating the mold base for 5 minutes thereby cleaning the surface of the mold base. Then $CH_4$ at 15 sccm and Ar at 30 sccm were introduced into the ionizing chamber, and an a-C:H film was formed with a thickness of 1500 Å, at a gas pressure of $3\times10^{-4}$ Torr. In this operation the mold base was heated to 300° C. Three molds prepared under a same condition were heat treated in a furnace 29 shown in FIG. 9. After the furnace 29 was evacuated to $5\times10^{-6}$ Torr by an evacuating system 30, $N_2$ and $O_2$ were introduced from a gas inlet 31 to a pressure of 1.2 atom with an $O_2$ partial pressure of $1\times10^{-6}$ Torr. Molds were prepared by heating the mold base 32 in an infrared furnace 33 for 1 and 10 hours at 600° C., while another mold was prepared without such heating. Films formed on CVD-SiC wafers under the same conditions were evaluated. The ESCA analysis of the a-C:H film to the interface in the direction of depth provided the oxygen distribution of the specimens as shown in Table 1. Also, the adhesion strength of the film evaluated by a scratch tester, in shown in Table 1.

TABLE 1

| Heat treatment | $O_2$ concentration (at. %) | $O_2$ present area (Å) | Adhesion strength (nM) |
| --- | --- | --- | --- |
| none | 0 | 0 | 250 |
| 1 hour | 5 | 300 | 600 |
| 10 hours | 11 | 550 | 300 |

In a molding test similar to that in the example 1, the mold without heat treatment showed slight film peeling in the peripheral area after 250 moldings while the mold heated for 10 hours showed similar peeling after moldings one hundred and fifty (150) times, but the mold heated for 1 hour did not show defects such as film peeling even after moldings three hundreds (300) times.

(Example 4)

Molds were prepared with the $O_2$ plasma irradiating time of 0, 10 seconds, 5, 10 and 15 minutes at the preparation of the DLC film as in the example 1, and CVD SiC wafers for evaluation were prepared in the same manner. The evaluation samples were subjected to the ESCA surface analysis and the evaluation of adhesion strength by the scratch tester. The obtained results are summarized in Table 2.

TABLE 2

| $O_2$ process time | $O_2$ concentration (at. %) | $O_2$ present area (Å) | Adhesion strength (nM) |
| --- | --- | --- | --- |
| 0 sec. | 0 | 0 | 250 |
| 10 sec. | 1 | 5 | 300 |
| 5 min. | 5 | 250 | 600 |
| 10 min. | 10 | 500 | 550 |
| 15 min. | 15 | 750 | 300 |

The ESCA analysis of the a-C:H film to the interface in the direction of depth provided the oxygen distribution shown in Table 2, which also includes the result of evaluation of the adhesion strength of the film by the scratch tester.

In a molding test similar to that of the example 1, the mold without the $O_2$ plasma irradiation and the mold subjected to the irradiation for 15 minutes showed slight film peeling in the peripheral portion, respectively after moldings 250 and 100 times. However, the molds subjected to said irradiation for 5 and 10 minutes did not show defects such as film peeling even after molding 300 times.

(Example 5)

Figure 10:
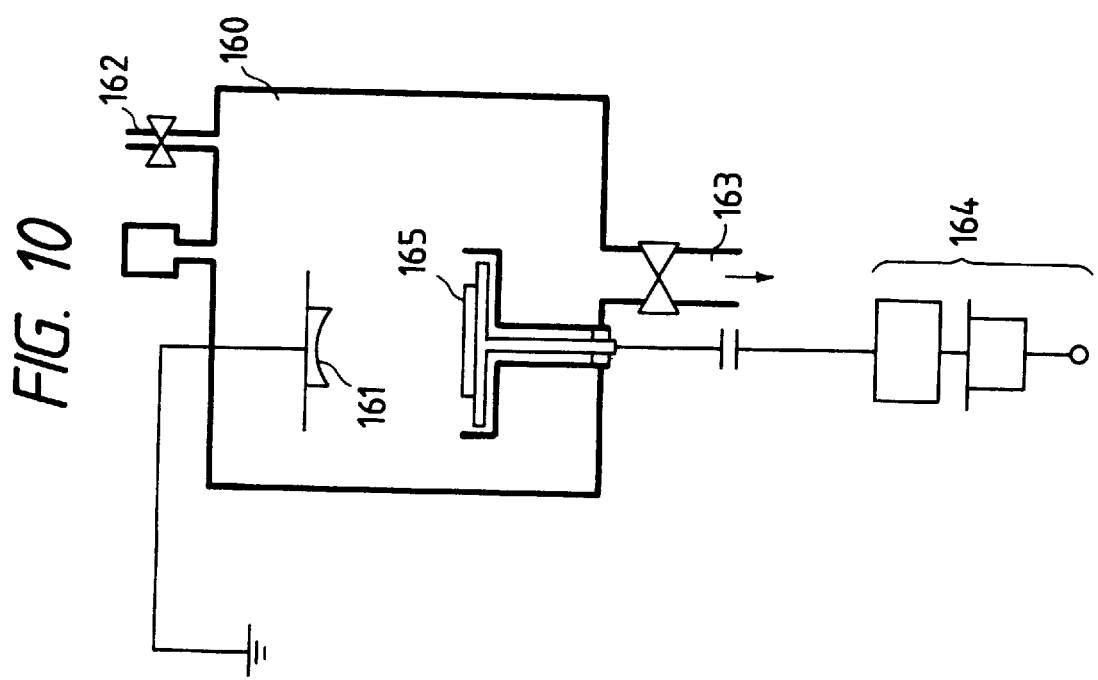
FIG. 10 is a schematic view of a sputtering apparatus employed in the embodiment of the present invention.

A mold base same as that in the example 1 was subjected to the elimination of the spontaneous oxide film at the surface by Ar reverse sputtering in a sputtering apparatus shown in FIG. 10. More specifically, a vacuum tank 160 was evacuated to $1\times\times10^{-6}$ Torr by an evacuating system 163, then Ar gas was introduced by a gas supply system 162 to a pressure of $3\times10^{-3}$ Torr. The mold base 161 was sputtered by applying a high frequency voltage of 13.56 MHz by an RF power source 164. Then, $O_2$ gas was introduced to a pressure of $4\times10^{-3}$ Torr, and a high frequency voltage of 13.56 MHz was applied by the RF power source 164 with a power of 700 W to generate $O_2$ plasma, to which the surface of the mold base was exposed for 5 minutes. Thereafter, sputtering was continued with a graphite target 165 of a purity of 99.99% utilizing Ar plasma to form a hard carbon film of a thickness of 2000 Å on the surface of the mold base. In this operation the base material was heated to 300° C., and the sputtering was conducted with a gas pressure of $4\times10^{-3}$ Torr and an RF power density of 4 W/cm². A molding test similar to that in the example 1, employing thus obtained mold provided results similar to those of the example 1.

(Example 6)

A mold base was processed in the same manner as in the example 1, and a DLC film of a thickness of 2000 Å was formed by conducting the film formation under the same conditions as in the example 1 for about 2 minutes with $O_2$ being mixed at 5 sccm with $C_6H_6$ and thereafter cutting off the supply of $O_2$. In a molding test similar to that of the example 1, thus obtained mold provided the results similar to those of the example 1.

[Embodiment of carbon ion implantation or carbon ion implantation followed by carbon film formation (examples 7–13)]

(Example 7)

FIGS. 1 and 2 also illustrate an embodiment of the mold of the present invention for optical element formation. FIG. 1 shows the state of the press molding surface for the optical element while FIG. 2 shows a state after the molding. In this embodiment, a numeral 2 in FIG. 1 indicates an ion implanted surface constituting the molding surface for the optical element.

The mold of the present invention for the optical element will be explained in detail in the following.

A mold base was prepared by working sintered SiC into a predetermined shape, then forming a polycrystalline SiC film by CVD, and mirror-polishing the molding surface. After sufficient washing, the mold base was subjected, in an ion implantation apparatus (not shown), to the implantation of $C^{+12}$ obtained by mass separation onto the mold surface with an energy of 60 keV and a concentration of $6\times10^{15}$ ion/cm². The surface roughness after the implantation was evaluated as $R_{max}=0.03$ μm.

Thus obtained mold was used in a molding operation as in the example 1, utilizing the molding apparatus shown in FIG. 4. In the observations under an optical microscope and a scanning electron microscope (SEM), the mold after moldings 300 times did not show defects such as scars or cracks, nor Pb precipitation resulting from reduction of PbO contained in the glass, nor glass fusion. Also, the molded products were satisfactory in the surface roughness, surface precision, transmittance and shape precision, and were free from Pb precipitation or gas retention.

The mold was also employed in a molding operation utilizing the molding apparatus of FIG. 6, in a similar manner as in the example 1. Even after moldings 3000 times, satisfactory results were observed in the state of the molding surface of the mold, the surface roughness of the molded optical element, and the releasing property of the mold from the molded optical element. Also, in the observations under an optical microscope and a scanning electron microscope, the molding surface did not show defects such as scars or cracks, nor Pb precipitation nor glass fusion.

(Example 8)

A mold base was prepared by working a sintered material composed of WC (84%), Tic (8%) and Tac (8%) into a predetermined shape, and mirror-polishing the molding surface to $R_{max}$=0.02 μm. The mold base material was placed in the ion implantation apparatus (not shown) as in the example 7, and was subjected to the implantation of $C^{+13}$ obtained by mass separation with an energy of 90 keV and a concentration of $7 \times 10^{15}$ ion/cm². For the purpose of comparison, molds were prepared also with implanting concentrations of $5 \times 10^{14}$ and $3 \times 10^{18}$ ion/cm², respectively. Each of these three molds was used in the molding apparatus shown in FIG. 4 for molding, as in the example 7, the flint optical glass SF14 (softening point Sp=586° C.; transition temperature Tg=485° C.) 300 times, and the obtained results are shown in Table 3.

TABLE 3

| Mold | Amount of ion implantation | Surface roughness of mold ($R_{max}$) | Mold releasing property |
| --- | --- | --- | --- |
| 1 | $7 \times 10^{15}$ ion/cm² | ≦0.03 μm | satisfactory |
| 2 | $5 \times 10^{14}$ ion/cm² | ≦0.03 μm | glass fusion |
| 3 | $3 \times 10^{18}$ ion/cm² | ≧0.03 μm | satisfactory |

In the observations under an optical microscope and a scanning electron microscope, the molds after the molding operations did not show, as in the example 7, defects such as scars or cracks, nor Pb precipitation resulting from reduction of PbO contained in the glass, nor the glass fusion. Also, the molded products were satisfactory in the surface roughness, surface precision, transmittance and shape precision and were free from Pb precipitation or gas retention.

(Example 9)

A mold subjected to the ion implantation as in the example 7 was subsequently heat treated at 800° C. A molding test as in the example 7, employing thus obtained mold provided results similar to those of the example 7.

(Example 10)

Figure 11:
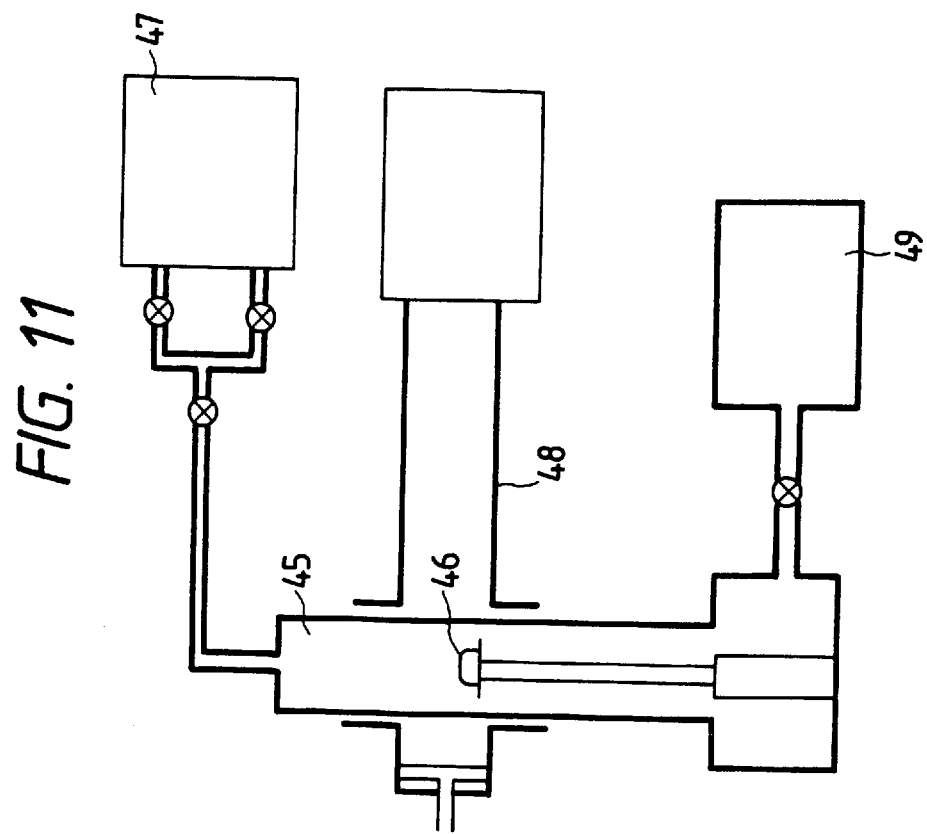
FIG. 11 is a schematic view of a microwave plasma CVD apparatus employed in the embodiment of the present invention.

A mold base was obtained by forming sintered $Si_3N_4$ into a predetermined shape and mirror-polishing it to a surface roughness of $R_{max}$=0.03 μm. Then, the molding surface was subjected to the implantation of $C^{+12}$ with a concentration of $5 \times 10^{15}$ ion/cm², as in the example 7. Then, prior to the formation of a diamond film, the molding surface was subjected to a scarring treatment by ultrasonic vibration in alcohol in which diamond grinding particles of a diameter of 5–10 μm were dispersed in order to increase the diamond nucleation density. Then, after sufficient washing, the mold base was placed in a microwave CVD apparatus shown in FIG. 11, wherein shown are a plasma chamber 45, a mold 46, a gas supply system 47, a microwave oscillator 48 with a wave guide, and an evacuating system 49. At first the apparatus was evacuated to $1 \times 10^{-6}$ Torr, then $CH_4$ at 1.5 sccm and $H_2$ at 350 sccm were introduced from the gas supply system to a pressure of 55 Torr, and microwave of 2.45 GHz was applied with a power of 800 W. The mold base was heated to 850° C. to form a polycrystalline diamond film of a thickness of 15 μm thereon. Since the film had a relative rough surface of P–V=0.1 μm, it was mirror polished to a surface roughness of $R_{max}$=0.02 μm with diamond grinding particles in a polishing apparatus shown in FIG. 7. Polishing in an aspherical shape was attained by local polishing with a polishing dish, which was rotated at 1000 rpm and constantly directed perpendicularly to the polished surface. A molding test as in the example 7, employing thus obtained mold, provided results similar to those in the example 7.

(Example 11)

A mold base subjected to the ion implantation as in the example 9 and then heat treated was subjected to the formation of an a-C:H film in an IBD (ion beam deposition) apparatus shown in FIG. 8, as employed in the example 3. At first Ar was introduced at 30 sccm from the gas inlet into the ionizing chamber and ionized. Then, an ion beam was extracted by applying a voltage of 450 V to the extracting grid and was directed to the mold base for 5 minutes, thereby cleaning the molding surface. Then, $CH_4$ at 20 sccm and Ar at 30 sccm were introduced into the ionizing chamber, and an a-C:H film of a thickness of 1000 Å was formed under a gas pressure of $4 \times 10^{-4}$ Torr. In this operation, the mold base was heated at 300° C. A molding test as in the example 7, employing the thus obtained mold, provided results similar to those in the example 7.

(Example 12)

A mold base as in the example 11 was subjected to the limitation of the surfacial spontaneous oxide film by reverse Ar sputtering in the sputtering apparatus shown in FIG. 10. More specifically, after the vacuum tank 160 was evacuated to $1 \times 10^{-6}$ Torr by means of the evacuating system 163, Ar gas was introduced from the gas supply system 162 with a pressure of $3 \times 10^{-3}$ Torr and a high frequency voltage of 13.56 MHz was applied by the RF power source 164 to sputter the mold base. Then sputtering was continued employing a graphite target 165 of a purity of 99.99% and Ar plasma to form a hard carbon film of a thickness of 2000 Å on the base material. In this operation, the mold base was heated to 300° C., and the sputtering was conducted with a gas pressure of $4 \times 10^{-3}$ Torr and an applied RF power density of 5 W/cm². A molding test as in the example 7, employing thus obtained mold, provided results similar to those in the example 7.

(Example 13)

After a mold base was processed as in the example 11, it was placed in the ECR plasma CVD apparatus shown in FIG. 3. After the apparatus was evacuated to $1 \times 10^{-6}$ Torr, $H_2$ was supplied at 50 sccm from the gas supply system to a pressure of $2 \times 10^{-6}$ Torr. Then microwave of 2.45 GHz was applied by the oscillator 8 with a power of 700 W, and the ion implanted molding surface was irradiated with $H_2$ plasma of 0.1 mA/cm² for 10 minutes. Then, $C_6H_6$ was introduced at 30 sccm from the gas supply system with a pressure of $2.5 \times 10^{-3}$ Torr, and microwave of 2.45 GHz was applied with a power of 600 W. At the same time the external electromagnet 12 applied a diverging magnetic field of 1500 Gauss at the microwave introducing window 11, 875 Gauss at the exit of the plasma chamber and 650 Gauss at the base material. Also a negative bias of −500 V was applied to the mold base by a bias source (not shown), and a DLC film of a thickness of 1500 Å was formed. In this operation, the mold base was heated to 300° C. A molding test as in the example 7, employing thus obtained mold, provided results similar to those in the example 7.

[Embodiment of effecting ion implantation during or after carbon film formation (examples 14–23)]

(Example 14)

FIGS. 1 and 2 also illustrate an embodiment of the mold of the present invention for optical element formation. FIG. 1 shows the state of the press molding surface for the optical element while FIG. 2 shows a state after the molding. In this embodiment, a numeral 2 in FIG. 1 indicates an a-C:H film subjected to ion beam mixing, constituting the molding surface for molding an optical element.

The mold of the present invention for the optical element will now be explained in detail as follows.

A mold base was obtained by working sintered SiC into a predetermined shape, then forming a polycrystalline SiC film by CVD mirror-polishing the molding surface. After sufficient washing, the mold base material was placed in the IBD apparatus shown in FIG. 8, and an a-C:H film was formed with a thickness of 1500 Å. After the vacuum tank was evacuated to $10^{-6}$ Torr, Ar gas was introduced at 20 sccm from the gas inlet into the ionizing chamber and was ionized. An ion beam was extracted by applying a voltage of 500 V to the ion beam extracting grid, thereby irradiating the mold base for 10 minutes and thus cleaning the molding surface thereof. Subsequently, $CH_4$ at 16 sccm and $H_2$ at 32 sccm were introduced into the ionizing chamber, and the a-C:H film was formed with a thickness of 1500 Å under a gas pressure of $4.5 \times 10^{-4}$ Torr. Then, in an unrepresented ion implanting apparatus, $C^{+12}$ obtained by mass separation was implanted into the a-C:H film with an energy of 50 keV and a concentration of $1 \times 10^{17}$ ion/cm$^2$. The surface roughness of the molding surface after the ion implantation was evaluated as $R_{max}$=0.03 Vm.

The thus obtained mold was employed in a molding operation as in the exmaple 1, in the molding apparatus shown in FIG. 4. In the observations under an optical microscope and a scanning electron microscope, the mold after moldings 300 times did not show defects such as scars or cracks, nor Pb precipitation resulting from reduction of PbO contained in the glass, nor glass fusion. Also, the molded products were satisfactory in the surface roughness, surface precision, transmittance and shape precision, and were free from Pb precipitation or gas retention.

The mold was also used in a molding operation similar to that of the example 1, utilizing the molding apparatus shown in FIG. 6. Even after moldings of 3000 times the surface roughness of the molding surface of the mold and of the molded optical element, and the releasing property of the mold from the molded optical element were evaluated as satisfactory. Also, in the observations under an optical microscope and a scanning electron microscope, the molding surface did not show defects such as scars or cracks, nor Pb precipitation nor glass fusion.

(Example 15)

A base material was obtained by working a sintered material consisting of WC (84%), TiC (8%) and TaC (8%) into a predetermined shape, and mirror-polishing the molding surface to $R_{max}$=0.02 μm. The mold base material was placed in the sputtering apparatus shown in FIG. 10, and the spontaneous oxide film on the surface of the mold base was eliminated by reverse Ar sputtering. More specifically, after the vacuum tank 160 was evacuated to $1 \times 10^{-6}$ Torr by the evacuating system 163, Ar gas was introduced to a pressure of $1 \times 10^{-3}$ Torr from the gas supply system 162, and a high frequency voltage of 13.56 MHz was applied from the RF power source 164 to sputter the mold base material. Then, in continuation, sputtering was conducted with a graphite target 165 of a purity of 99.99% and with Ar plasma to form a hard carbon film of a thickness of 500 Å on the molding surface. The sputtering was conducted with a gas pressure of $3 \times 10^{-3}$ Torr and an applied RF power density of 6 W/cm$^2$. The mold base was then placed in a composite IBD apparatus shown in FIG. 12, wherein shown are a mold base and a holder 166 therefor, a high energy ion source 167 for mixing, a low energy ion source 168 for forming an a-C:H film, and an evaporation source 169 consisting of an electron gun. The ion sources 167, 168 are basically same in structure as in the IBD appratus employed in the example 14. At first, the mold base was opposed to the ion source 167, then $CH_4$ and $H_2$ were introduced and ionized in the source 167, and ion implantation was conducted with an energy of 50 keV and a concentration of $6 \times 10^{-16}$ ion/cm$^2$. Subsequently, an a-C:H film of a thickness of 1500 521 was formed with the ion source 168 under the same conditions as in the example 14.

Thus obtained mold was used in the molding apparatus shown in FIG. 4, for molding flint optical glass SF14 (softening point Sp=586° C.; transition temperature Tg=485° C.) 300 times as in the example 14.

In the observations under an optical microscope or a scanning electron microscope, the mold after the molding operations did not show defects such as scars or cracks, nor Pb precipitation resulting from reduction of PbO contained in the glass, nor glass fusion. Also, the molded products were satisfactory in the surface roughness, surface precision, transmittance and shape precision, and were free from Pb precipitation or gas retention.

(Example 16)

The mold base of the example 15 was placed in the ECR-PCVD apparatus shown in FIG. 3 and was subjected to the formation of a DLC film of a thickness of 1000 Å. More specifically, after the apparatus was evacuated to $1 \times 10^{-6}$ Torr, $C_6H_6$ was introduced from the gas supply system at 35 sccm to a pressure of $3.0 \times 10^{-3}$ Torr, and microwave of 2.45 GHz was applied by the oscillator 8 with a power of 700 W. At the same time the external electromagnet 12 applied a diverging magnet field of 1500 Gauss at the microwave introducing window, 875 Gauss at the exit of the plasma chamber, and 650 Gauss at the position of the mold base, and an RF bias of 500 V was applied to the mold base. Then, elements shown in Table 4 were implanted as in the example 14 by an unrepresented ion implantation apparatus. Subsequently, flint optical glass SF 14 (softening point Sp=586° C.; transition temperature Tg=485° C.) was molded 300 times the same manner as in the example 4 with the molding apparatus shown in FIG. 4. The obtained results are shown in Table 4.

TABLE 4

| Mold | Element | Energy (keV) | Amount of implantation (ion/cm$^2$) | Releasing property | Durability of mold |
|---|---|---|---|---|---|
| 1 | C | 50 | $9 \times 10^{13}$ | glass fusion | film peeled after moldings 100 times |
| 2 | C | 50 | $1 \times 10^{14}$ | satisfactory | no peeling after moldings 300 times |
| 3 | Ne | 110 | $5 \times 10^{14}$ | satisfactory | no peeling after moldings 300 times |
| 4 | Ar | 110 | $5 \times 10^{14}$ | satisfactory | no peeling after moldings 300 times |
| 5 | Xe | 110 | $2 \times 10^{15}$ | satisfactory | no peeling after moldings 300 times |
| 6 | Kr | 110 | $2 \times 10^{15}$ | satisfactory | no peeling after moldings 300 times |
| 7 | N | 120 | $1 \times 10^{17}$ | satisfactory | no peeling after moldings 300 times |
| 8 | O | 120 | $1 \times 10^{16}$ | satisfactory | no peeling after moldings 300 times |
| 9 | H | 120 | $7 \times 10^{17}$ | satisfactory | no peeling after moldings 300 times |
| 10 | He | 120 | $7 \times 10^{17}$ | satisfactory | no peeling after moldings 300 times |
| 11 | C | 100 | $2 \times 10^{18}$ | satisfactory | no peeling after moldings 300 times |

(Example 17)

A mold base on which a DLC film was formed under the same conditions as in the example 16 was placed in the IBD apparatus of the example 15, and was subjected to the implantation of N with an energy of 100 keV and a concentration of $1\times10^{17}$ ion/cm² by the high energy ion source. Then, in continuation, an a-H:C film of a thickness of 1500 Å was formed by the low energy ion source. A molding test as in the example 14, employing thus obtained mold, provided results similar to those of the example 14.

(Example 18)

Figure 12:
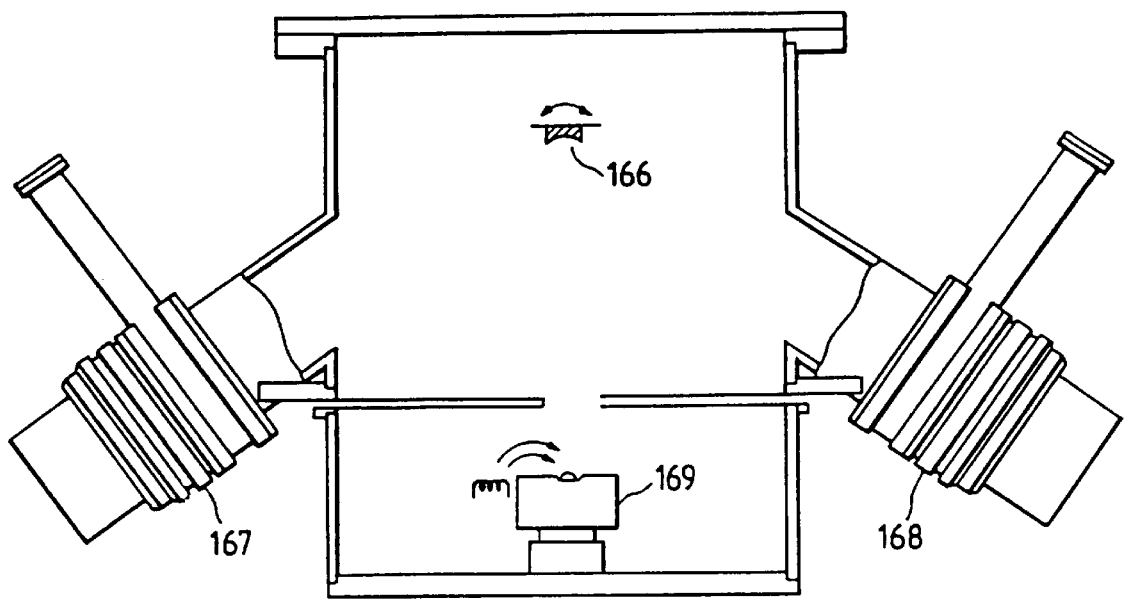
FIG. 12 is a schematic view of composite IBD apparatus employed in the embodiment of the present invention.

The mold base of the example 15 was placed, after sufficient washing, in the film forming apparatus shown in FIG. 12. After the apparatus was evacuated to $1\times10^{-7}$ Torr, Ar gas was introduced into the low energy ion source with a pressure of $1\times10^{-3}$ Torr, the oxide film present on the surface of the mold base was eliminated by 500 Å by Ar ion beam etching. In continuation, an a-C:H film of a thickness of 2500Å was formed by effecting the formation of the a-C:H film with the low energy ion source and simultaneously irradiating C ions of an energy of 40 keV with the high energy ion source. A molding test as in the example 14, employing thus obtained mold, provided results similar to those of the example 14.

(Example 19)

In the formation of the a-C:H film in the process of the example 18, the high energy ion source irradiated N ions of 40 keV, instead of C ions, for initial 5 minutes from the start of film formation, and then the film formation was continued with the low energy ion source only, thereby obtaining a film of 3000 Å. A molding test as in the example 14, employing thus obtained mold, provided results similar to those in the example 14.

(Example 20)

A mold base was prepared by working sintered $Si_3N_4$ into a predetermined shape, and mirror-polishing said material to a surface roughness of $R_{max}$=0.03 µm. This mold base was placed in the composite IBD apparatus shown in FIG. 12, and, after the vacuum tank was evacuated to $1\times10^{-6}$ Torr, a Si film of a thickness of 500 Å was formed with the electron gun 169, under a pressure of $1\times10^{-5}$ Torr. Then, an a-C:H film of a thickness of 5000 Å was formed by the low energy ion source, with simultaneous irradiation of C ions of 50 keV by the high energy ion source under the same conditions as in the example 18. A molding test as in the example 14, employing thus obtained mold, provided results similar to those in the example 14.

(Example 21)

Figure 13:
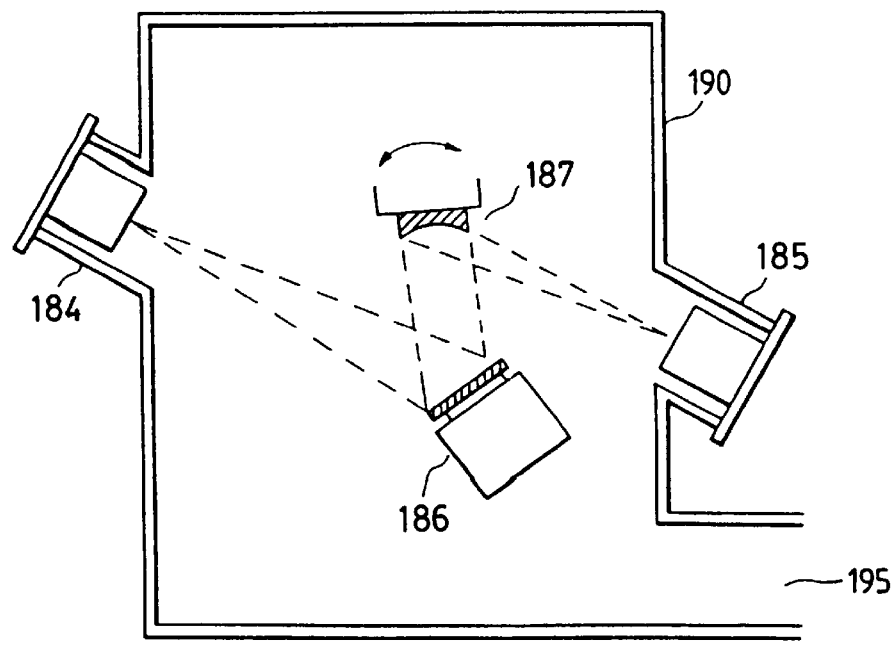
FIG. 13 is a schematic view of an ion beam sputtering apparatus employed in the embodiment of the present invention.

A mold base same as in the example 15 was placed in an ion beam sputtering apparatus shown in FIG. 13, provided with a vacuum tank 190, a sputtering ion source 184, an irradiating ion source 185, a sputtering target 186, a mold and a holder 187, and an evacuating system 195. After the apparatus was evacuated to $1\times10^{-6}$ Torr, Ar ions from the sputtering ion source 184 were extracted with a voltage of 0.7 kV to irradiate the graphite target 186 of a purity of 99.99%, thereby effecting sputtering on the mold 187 to form a hard carbon film, thereon. At the same time the ion source 185 irradiated N ions of 40 keV, thereby obtaining a film of a thickness of 3000 Å. This operation was conducted with a temperature of base material of 300° C., and a pressure of $2.5\times10^{-14}$ Torr. A molding test as in the example 14, employing thus obtained mold, provided results similar to those of the example 14.

(Example 22)

Figure 14:
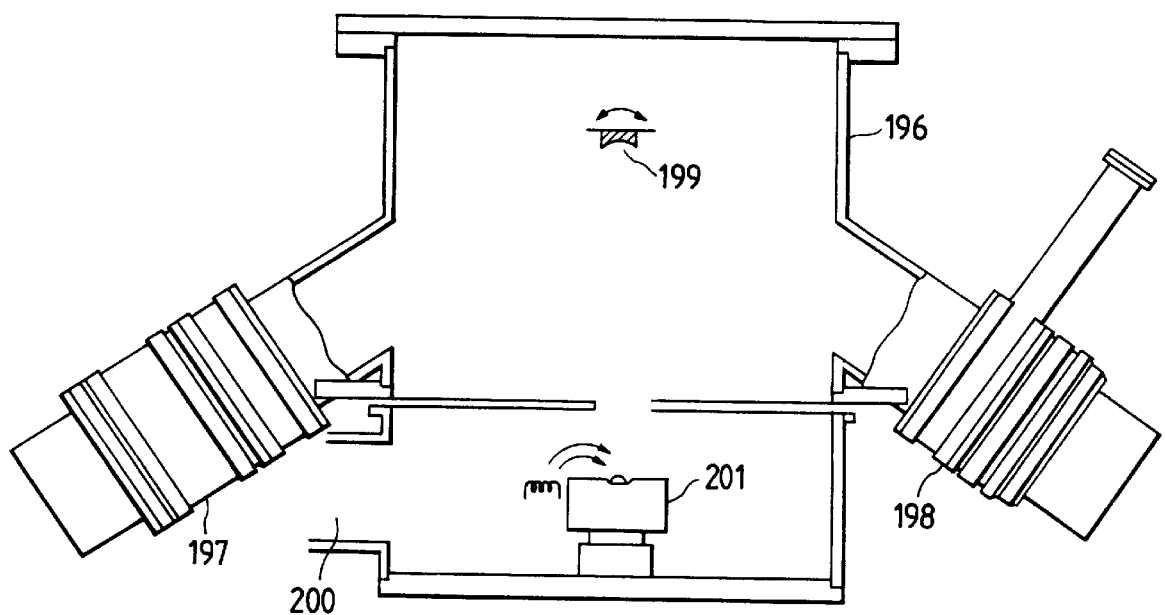
FIG. 14 is a schematic view of a composite IBD apparatus employed in the embodiment of the present invention.

A mold base same as in the example 14 was placed in a composite IBD apparatus provided with an ECR ion source and an ion irradiating Kaufman ion source, as shown in FIG. 14. In this drawing there are shown a vacuum tank 196, an ECR ion source 197, an ion irradiating Kaufman ion source 198, a mold and a holder 199, an evacuating system 200, and an electron gun 201. After the apparatus is evacuated to $1\times10^{-6}$ Torr, $C_6H_6$ was introduced at 40 sccm into the ECR ion source, to a pressure of $4.5\times10^{-3}$ Torr. Then, microwave of 2.45 GHz was applied by the oscillator and the wave guide with a power of 700 W, and an RF bias of 500 V was applied to the mold base, whereby a DLC film was formed with a thickness of 2500 Å. The film formation was conducted with simultaneous irradiation of N ions of 50 keV by the Kaufman ion source. A molding test as in the example 14, employing the thus obtained mold, provided results similar to those of the example 14.

(Example 23)

After the surfacial oxide film of the mold base was removed as in the example 18, graphite of a purity of 99.99% was evaporated with the electron gun shown in FIG. 12, and a mixture of N:He=7:3 was introduced at 20 sccm to the low energy ion source to effect an assisting irradiation with an ion beam of 200 eV and 4 mA. At the same time irradiation of C ions of 50 keV was conducted for 10 minutes by the high energy ion source. The graphite evaporation and the N ion irradiation were continued after the irradiation of C ions was terminated, thereby forming a diamond film of a thickness of 1 µm. Since the film had a surface roughness of $R_{max}$=0.03 µm, it was employed in the molding operation without mechanical polishing. A molding test as in the example 14, employing the mold, provided results similar to those in the example 14.

As explained in the foregoing, the first mold of the present invention, for forming an optical element, having a carbon film such as a diamond film, a DLC film, an a-H:C film or a hard carbon film at least on the molding surface of a mold base, is provided at the interface between the carbon film and the mold base with an area in which a constituent element of the mold base and a constituent element of the film are bonded to oxygen. Thus, there is obtained a molding mirror surface that has little defects and does not generate film peeling or cracks in the glass molding.

The second mold of the present invention, for forming an optical element, is subjected to carbon ion injection at least on the molding surface of a mold base, or to such carbon ion injection followed by the formation of a carbon film such as a diamond film, a DLC film, an a-H:C film or a hard carbon film. Thus, there is obtained a molding mirror surface that has little defects and does not generate film peeling or cracks in the glass molding.

The third mold of the present invention, for forming an optical element, is subjected during or after the formation of a carbon film such as a diamond film, a DLC film, an a-H:C film or a hard carbon film at least on the molding surface of a mold base to the injection of ions of a high energy having a flying path larger than the film interface preferably with a concentration of $10^{-14}$ ion/cm² or higher, in order to mix the atoms of the mold base and the film at the interface thereof, thereby inducing elimination of the sharp interface or formation of a compound by atom mixing, thus achieving significant improvement in the adhesion strength of the film and the mold base. Thus, there is obtained a molding mirror surface that has little defects and does not generate film peeling or cracks in the glass molding.

Such molds, when employed in the molding of the optical elements, show extremely satisfactory releasing property from the molded glass, and also can provide molded products satisfactory in the surface roughness, surface precision, transmittance and shape precision. Also such molds are extremely durable without defects such as film peeling, cracks or scars even when the press molding operation is repeated for a prolonged period.

Thus, the mold of the present invention for forming the optical element can achieve improvement in the productivity and reduction in the cost.

What is claimed is:

1. A mold for press molding an optical element of glass comprising:
   (a) a mold base having a molding surface;
   (b) a carbon film; and
   (c) an interfacial region joining said molding surface and said carbon film, said interfacial region containing implanted ions to improve adhesion between said molding surface and said carbon film;
   wherein said mold is produced by the steps of forming said carbon film on said molding surface, and thereafter implanting the ions into both said molding surface and said carbon film so as to form said interfacial region.

2. A mold according to claim 1, wherein said carbon film is selected from the group consisting of a diamond film, a hydrogenated amorphous carbon film, a hard carbon film, or a film consisting of a mixture of at least two thereof.

3. A mold according to claim 1 wherein the concentration of implanted ions is from $10^{14}$ to $10^8$ ions/cm$^2$.

4. A mold according to claim 1, wherein said implanted ions are selected from the group consisting of carbon, nitrogen, neon, argon, xenon, krypton, oxygen, hydrogen and helium.

5. A mold for press molding an optical element of glass comprising:
   (a) a mold base having a molding surface;
   (b) a carbon film; and
   (c) an interfacial region joining said molding surface and said carbon film, said interfacial region containing implanted ions to improve adhesion between said molding surface and said carbon film;
   wherein said mold is produced by the steps of forming said carbon film on said molding surface and simultaneously implanting ions into said molding surface and said carbon film so as to form said interfacial region.

6. A mold according to claim 5 wherein the concentration of implanted ions is from $10^{14}$ to $10^{18}$ ions/cm$^2$.

7. A mold according to claim 5, wherein said implanted ions are selected from the group consisting of carbon, nitrogen, neon, argon, xenon, krypton, oxygen, hydrogen and helium.

8. A mold according to claim 5, wherein said carbon film is selected from the group consisting of a diamond film, a hydrogenated amorphous carbon film, a hard carbon film, or a film consisting of a mixture of at least two thereof.

* * * * *

UNITED STATES PATENT AND TRADEMARK OFFICE
CERTIFICATE OF CORRECTION

PATENT NO. : 5,855,641
DATED : January 5, 1999
INVENTOR(S) : YASUSHI TANIGUCHI

It is certified that error appears in the above-identified patent and that said Letters Patent is hereby corrected as shown below:

On the title page,
At [56] References Cited

FOREIGN PATENT DOCUMENTS

"5460312" should read --54-60312--,
"1301864" should read --1-301864--,
"2283627" should read --2-283627--, and
"5124825" should read --5-124825--.

At [57] ABSTRACT line 2,

"contains" should read --containing--.

Column 1

Line 6, "5,811,780;" should read --5,711,780;--.

Column 2

Line 39, "prevented," should read --prevented--.

Column 3

Line 57, "$_{10}{}^{18}$" should read --$10^{18}$--.

UNITED STATES PATENT AND TRADEMARK OFFICE
CERTIFICATE OF CORRECTION

| | | |
|---|---|---|
| PATENT NO. : | 5,855,641 | Page 2 of 3 |
| DATED : | January 5, 1999 | |
| INVENTOR(S) : | YASUSHI TANIGUCHI | |

It is certified that error appears in the above-identified patent and that said Letters Patent is hereby corrected as shown below:

Column 4

Line 25, "such" should read --such as--.
    Line 31, "interface the region where the" should read --interface.--.
    Line 32, delete line 32 in its entirety.
    Line 33, "interface is referred to as the interfacial region." should be deleted.
    Line 39, "penetrates" should read --penetrate--.

Column 7

Line 9, "kg/cm." should read --$kg/cm^2$.--
    Line 23, "hundreds" should read --hundred--.

Column 8

Line 18, "thousands" should read --thousand--.

Column 9

Line 14, "tester, in" should read --tester, is--.
    Line 32, "hundreds" should read --hundred--.

Column 10

Line 3, "$1xx10^{-6}$" should read --$1 \times 10^{-6}$--.

UNITED STATES PATENT AND TRADEMARK OFFICE
CERTIFICATE OF CORRECTION

PATENT NO. : 5,855,641

DATED : January 5, 1999

INVENTOR(S) : YASUSHI TANIGUCHI

It is certified that error appears in the above-identified patent and that said Letters Patent is hereby corrected as shown below:

<u>Column 13</u>

Line 23, "Vm." should read --$\mu$m.--

<u>Column 14</u>

Line 5, "1500 521" should read --1500Å--.

<u>Column 15</u>

Line 55, "film," should read --film--.

Signed and Sealed this

First Day of February, 2000

*Attest:*

Q. TODD DICKINSON

*Attesting Officer*     *Acting Commissioner of Patents and Trademarks*